US011682818B2

(12) United States Patent
Chang et al.

(10) Patent No.: US 11,682,818 B2
(45) Date of Patent: Jun. 20, 2023

(54) ANTENNAS-IN-PACKAGE VERIFICATION BOARD

(71) Applicant: TMY Technology inc., Taipei (TW)

(72) Inventors: Su-Wei Chang, Taipei (TW);
Chueh-Jen Lin, Taipei (TW);
Wen-Tsai Tsai, Taipei (TW);
Tzu-Chieh Hung, Taipei (TW); Yang Tai, Taipei (TW); Chien-Tse Fang, Taipei (TW); Po-Chia Huang, Taipei (TW); Te-Liang Sun, Taipei (TW);
Ying-Yen Lu, Taipei (TW)

(73) Assignee: TMY Technology Inc., Taipei (TW)

( * ) Notice: Subject to any disclaimer, the term of this patent is extended or adjusted under 35 U.S.C. 154(b) by 455 days.

(21) Appl. No.: 16/993,351

(22) Filed: Aug. 14, 2020

(65) Prior Publication Data

US 2021/0050674 A1 Feb. 18, 2021

(51) Int. Cl.
| | |
|---|---|
| *H01P 5/02* | (2006.01) |
| *H01P 3/08* | (2006.01) |
| *H01Q 13/02* | (2006.01) |
| *H01Q 19/185* | (2006.01) |
| *H01Q 21/29* | (2006.01) |
| *H04B 17/00* | (2015.01) |
| *G01R 31/28* | (2006.01) |

(52) U.S. Cl.
CPC .......... *H01P 5/028* (2013.01); *G01R 31/2822* (2013.01); *H01P 3/082* (2013.01); *H01P 3/088* (2013.01); *H01P 5/02* (2013.01); *H01Q 13/02* (2013.01); *H01Q 19/185* (2013.01); *H01Q 21/293* (2013.01); *H04B 17/0085* (2013.01)

(58) Field of Classification Search
CPC .......... H01P 5/028; H01P 3/082; H01P 3/088; H01P 5/02; G01R 31/2822; G01R 29/10; H01Q 13/02; H01Q 19/185; H01Q 21/293; H01Q 15/06; H01Q 15/14; H01Q 19/06; H01Q 3/267; H01Q 19/104; H04B 17/0085; H04B 17/00
See application file for complete search history.

(56) References Cited

U.S. PATENT DOCUMENTS

| 10,564,202 B2 * | 2/2020 | Schrattenecker ......... G01S 7/40 |
| 2014/0370821 A1 * | 12/2014 | Guterman ............. H04W 24/00 |
| | | 455/67.14 |
| 2015/0369840 A1 * | 12/2015 | Treibergs .......... H01L 23/49517 |
| | | 324/755.05 |

(Continued)

*Primary Examiner* — Akm Zakaria
(74) *Attorney, Agent, or Firm* — JCIPRNET

(57) ABSTRACT

An antennas-in-package (AiP) verification board is provided, which includes a carrier board configured for disposing an antenna array or an electronic circuit; and a plurality of SMPM connectors. The plurality of SMPM connectors are arranged in an array on the carrier board and electrically connected with the antenna array or the electronic circuit of the carrier board for testing the characteristics of the antenna array on the carrier board or the characteristics of the electronic circuit on the carrier board. The AiP verification board is fixed on a beamforming test platform. In addition to the aforementioned AiP verification board, an AiP verification board including a plurality of adaptor structures and an AiP verification board including a plurality of connectors and a plurality of adaptor structures are also provided.

15 Claims, 15 Drawing Sheets

(56) References Cited

U.S. PATENT DOCUMENTS

| | | | |
|---|---|---|---|
| 2019/0013830 A1* | 1/2019 | Hoglund | H04B 1/3888 |
| 2019/0067824 A1* | 2/2019 | Fina | H01Q 13/08 |
| 2021/0011069 A1* | 1/2021 | Chen | G01R 31/2896 |
| 2021/0364547 A1* | 11/2021 | Mroczkowski | G01R 1/045 |
| 2021/0376463 A1* | 12/2021 | Massman | H01Q 21/0087 |
| 2022/0099722 A1* | 3/2022 | Wang | H04B 17/101 |

* cited by examiner

ANTENNAS-IN-PACKAGE VERIFICATION BOARD

BACKGROUND

1. Technical Field

The present disclosure relates to verification and test of antennas-in-package (AiP). In particular, the present disclosure relates to an AiP verification board suitable for millimeter wave (mmWave) 5G mobile communication.

2. Description of Related Art

Antennas-in-package (AiP) is a technology for integrating one or more antennas and transceivers into a standard surface-mount device. It has been widely used in 60 GHz gesture sensors, 77 GHz automobile radars, 94 GHz phased arrays, or even image sensors up to 122 GHz and wireless networks up to 300 GHz. In addition, because the fifth-generation mobile communication (5G) millimeter wave spectrum uses millimeter waves as carriers, it has sufficient bandwidth to provide next-generation user experiences and industrial applications, and AiP technology is gradually moving towards the development direction of 5G millimeter wave.

Nowadays, in the design of AiP, the upper layer of the circuit board is an antenna array, and the lower layer usually includes electronic circuits and electronic components. Therefore, usually the antenna array cannot be verified or tested alone, thus verification and test of electrical characteristics are possible only for the entire AiP system, which results in blind spots in the development and test of AiP.

Therefore, how to provide a verification board that can individually test antenna arrays, electronic circuits, electronic components and can combine antennas and electronic components at the same time to overcome the difficulties of AiP verification and reduce the time and cost of AiP development is one of the urgent issues in the art.

SUMMARY

In order to solve the above problems, an embodiment of the present disclosure provides an AiP verification board. The AiP verification board includes: a carrier board configured for disposing an antenna array or an electronic circuit; and a plurality of push-on connectors arranged in an array on the carrier board, wherein the plurality of push-on connectors are electrically connected with the antenna array or the electronic circuit on the carrier board for testing characteristics of the antenna array on the carrier board or characteristics of the electronic circuit on the carrier board.

Another embodiment of the present disclosure provides an AiP verification board. The AiP verification board includes: a carrier board configured for disposing an antenna array or an electronic circuit; at least one ground-signal-ground (GSG) through hole formed in the carrier board; and a plurality of adaptor structures arranged in an array on the carrier board, wherein the plurality of adaptor structures are electrically connected with the antenna array on the carrier board or the electronic circuit on the carrier board through the GSG through hole for testing characteristics of the antenna array on the carrier board or characteristics of the electronic circuit on the carrier board.

Another embodiment of the present disclosure provides an AiP verification board. The AiP verification board includes: a carrier board configured for disposing a radio frequency circuit; at least one ground-signal-ground (GSG) through hole formed in the carrier board; a plurality of connectors arranged in an array on one side of the carrier board; and a plurality of adaptor structures arranged in an array on another side of the carrier board, wherein the plurality of connectors are electrically connected with the plurality of adaptor structures through the GSG through hole.

BRIEF DESCRIPTION OF THE DRAWINGS

The drawings are incorporated in the present disclosure and constitute a part of the present disclosure to show various specific embodiments of the present disclosure and illustrate specific embodiments of the present disclosure.

DETAILED DESCRIPTION

The following specific embodiments illustrate the implementation of the present disclosure. Those skilled in the art can easily understand the other advantages and effects of the present disclosure based on the contents disclosed in this specification, and can also implement or apply the present disclosure through the other different specific embodiments.

In order to solve the aforementioned disadvantages of the conventional technology, the purpose of the present disclosure is to provide an AiP verification board suitable for millimeter wave (mmWave) fifth-generation mobile communications (5G). The specific embodiments of the present disclosure are described as follows.

The First Embodiment

Figure 1A:
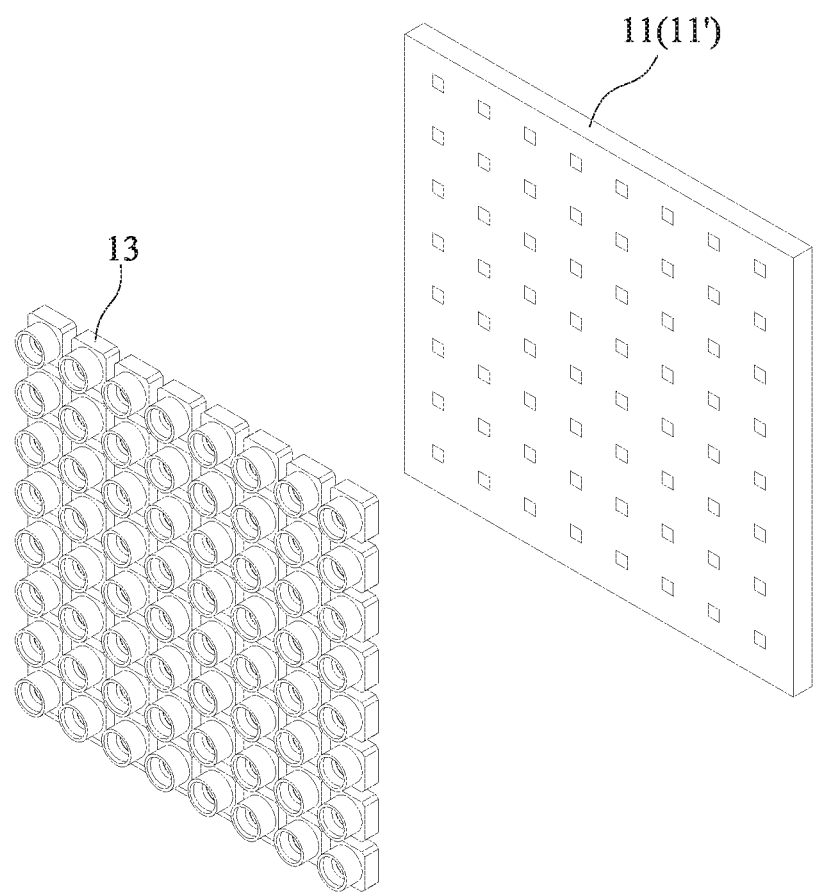
FIG. 1A is a perspective exploded view of the first embodiment of an AiP verification board of the present disclosure.
Figure 1B:
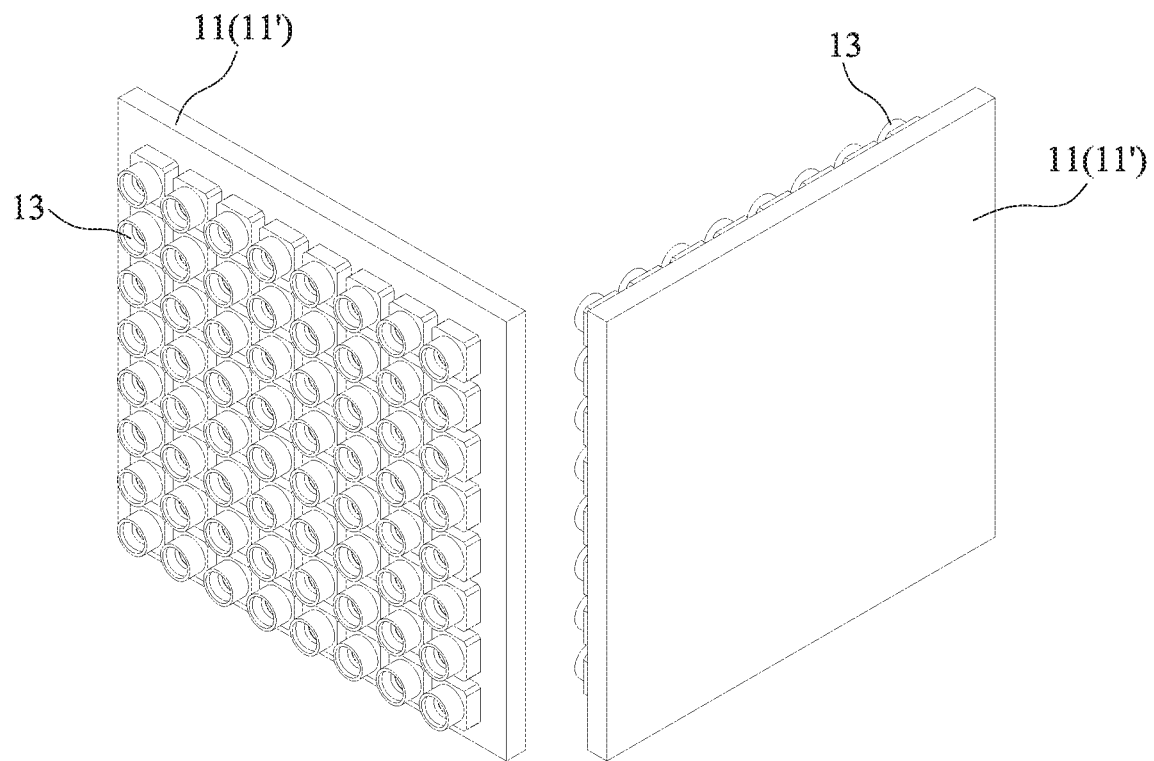
FIG. 1B is a perspective assembly view of the first embodiment of an AiP verification board of the present disclosure.

FIG. 1A is a perspective exploded view of the first embodiment of an AiP verification board of the present disclosure, and FIG. 1B is a perspective assembly view of the first embodiment of the AiP verification board of the present disclosure. The AiP verification board of the present disclosure includes a carrier board, such as an antenna array board 11 provided with an antenna array or an electronic circuit board 11' provided with an electronic circuit, and a plurality of push-on connectors, such as sub-miniature push-on micro (SMPM) connectors 13. A plurality of SMPM connectors 13 are arranged in an array on one side of the antenna array board 11 or the electronic circuit board 11'. The plurality of SMPM connectors 13 are electrically connected with the antenna array board 11 or the electronic circuit board 11' to test the characteristics of the antenna array on the antenna array board 11 or the characteristics of the electronic circuit on the electronic circuit board 11'.

In an embodiment, each of the plurality of SMPM connectors 13 includes a connection pad (not shown in the drawings). The antenna array on the antenna array board 11 is a millimeter wave (mmWave) antenna array, and the electronic circuit on the electronic circuit board 11' is a millimeter wave electronic circuit.

As shown in FIGS. 1A and 1B, the plurality of SMPM connectors 13 are disposed on a single side of the antenna array board 11 or the electronic circuit board 11', and the plurality of SMPM connectors 13 are arranged in an 8×8 SMPM connector array. The plurality of SMPM connectors 13 can be directly and electrically connected with the antenna array board 11 or the electronic circuit board 11'. Therefore, since the plurality of SMPM connectors 13 can be directly connected with the test equipment, this embodiment can test the characteristics of the antenna array of the antenna array board 11 and the characteristics of the electronic components of the electronic circuit board 11' separately through the plurality of SMPM connectors 13, thereby reducing the difficulty of verification of millimeter wave antennas and its circuits. It is worth mentioning that the connection pad on each SMPM connector 13 can be designed or optimized into a suitable structure to achieve low-loss conversion.

In an embodiment, the AiP verification board provided with the plurality of SMPM connectors 13 can be fixed on a beamforming test platform, and the present disclosure can divide the AiP into antennas and circuits for separate tests. Therefore, it is not necessary to manufacture various circuit boards and antennas, thereby saving design costs.

The Second Embodiment

Figure 2A:
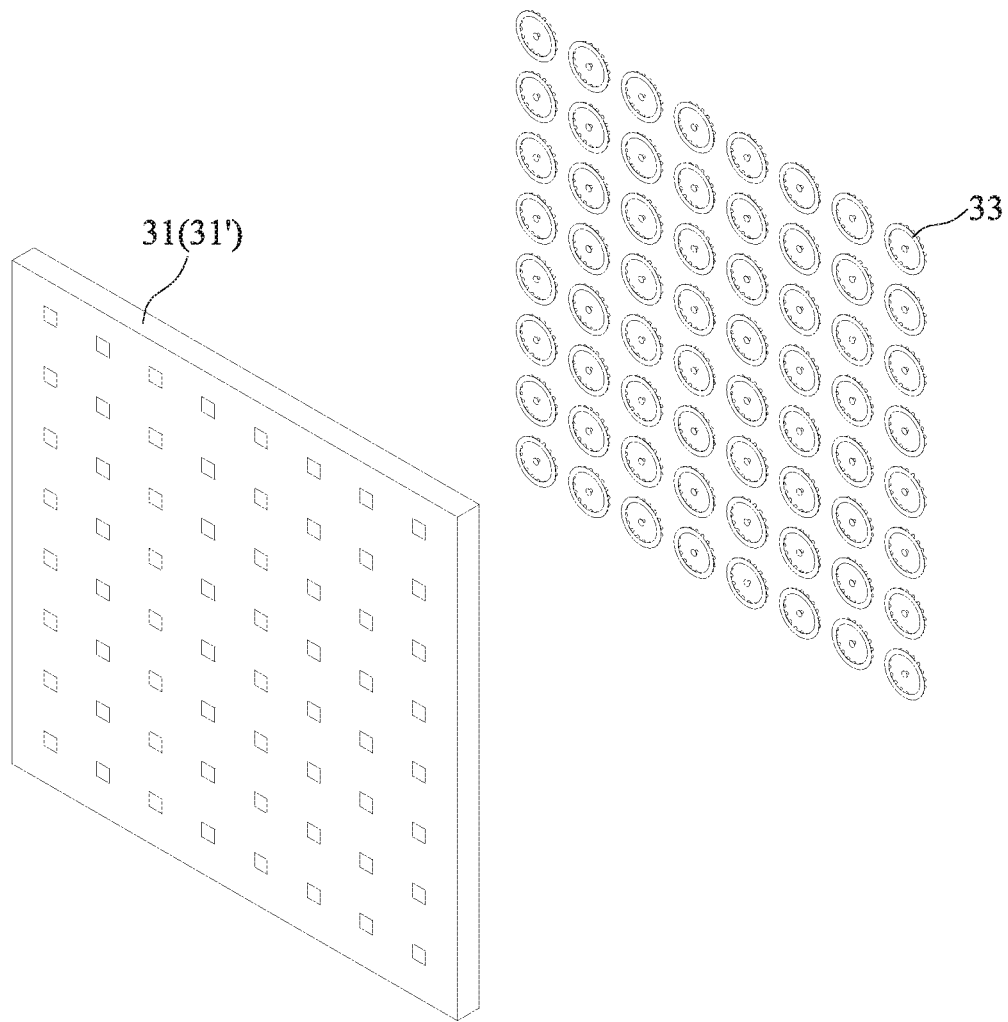
FIG. 2A is a perspective exploded view of the second embodiment of an AiP verification board of the present disclosure.
Figure 2B:
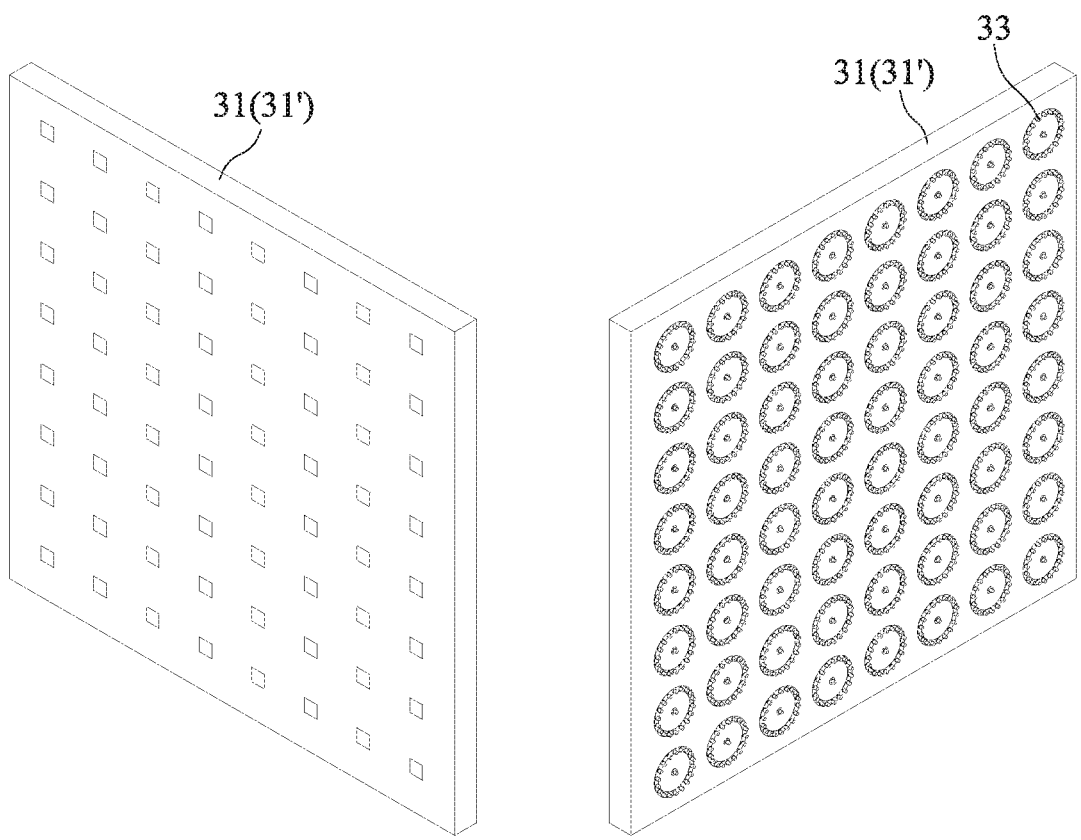
FIG. 2B is a perspective assembly view of the second embodiment of an AiP verification board of the present disclosure.

Please refer to FIG. 2A and FIG. 2B, which are the perspective exploded view and the perspective assembly view of the second embodiment of the AiP verification board of the present disclosure. The AiP verification board of this embodiment includes a carrier board, such as an antenna array board 31 provided with an antenna array or an electronic circuit board 31' provided with an electronic circuit, and a plurality of adaptor structures 33. The RDIS Invispin is taken as an example for the following descriptions for the plurality of adaptor structures 33, but the present disclosure is not limited thereto. The plurality of adaptor structures 33 are arranged in an array on one side of the antenna array board 31 or the electronic circuit board 31'. An antenna array is disposed on the other side of the antenna array board 31 or an electronic circuit is disposed on the other side of the electronic circuit board 31'. The plurality of adaptor structures 33 are electrically connected with the antenna array on the antenna array board 31 or the electronic circuit on the electronic circuit board 31' through ground-signal-ground (GSG) through holes to test the characteristics of the antenna array on the antenna array board 31 or the characteristics of the electronic circuit and components on the electronic circuit board 31'. In addition, the antenna array on the antenna array board 31 is a millimeter wave antenna array, and the electronic circuit on the electronic circuit board 31' is a millimeter wave electronic circuit.

Figure 2C:
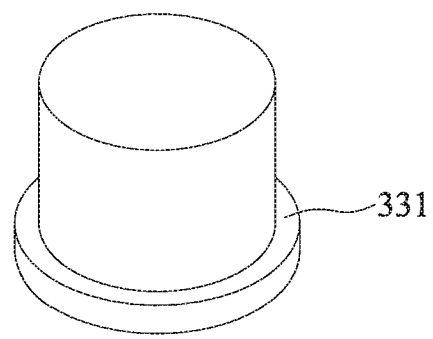
FIG. 2C is a perspective schematic diagram of an adaptor structure of the second embodiment of an AiP verification board of the present disclosure.

In an embodiment, as shown in FIG. 2C, each adaptor structure in the plurality of adaptor structures 33 includes a connection pad 331.

As shown in FIG. 2A and FIG. 2B, the plurality of adaptor structures 33 are arranged on one side of the antenna array board 31 or the electronic circuit board 31'. The plurality of adaptor structures 33 are arranged into an 8×8 adaptor structure conversion array. The plurality of adaptor structures 33 can be directly and electrically connected with the antenna array board 31 or the electronic circuit board 31'. Since the plurality of adaptor structures 33 can also be connected with the test equipment, this embodiment can test the characteristics of the antenna array of the antenna array board 31 and the characteristics of the electronic components of the electronic circuit board 31' separately through the plurality of adaptor structures 33 of the conversion array to reduce the difficulties of verification of millimeter wave antennas and its circuits. It is worth mentioning that since each adaptor structure 33 can provide a very small cross-section, therefore when connecting to other circuit boards (such as printed circuit boards), the circuit boards only need to have corresponding coaxial pads etched to be directly connected with the AiP verification board of the present disclosure without the need for additional connectors. In addition, the connection pad on each adaptor structure can be designed or optimized into a suitable structure to achieve low loss conversion.

In an embodiment, the AiP verification board with the plurality of adaptor structures 33 can be fixed on a beamforming test platform, and the present disclosure can divide the AiP into antennas and circuits for separate tests. Therefore, it is not necessary to manufacture various circuit boards and antennas, thereby saving design costs.

The Third Embodiment

Figure 3A:
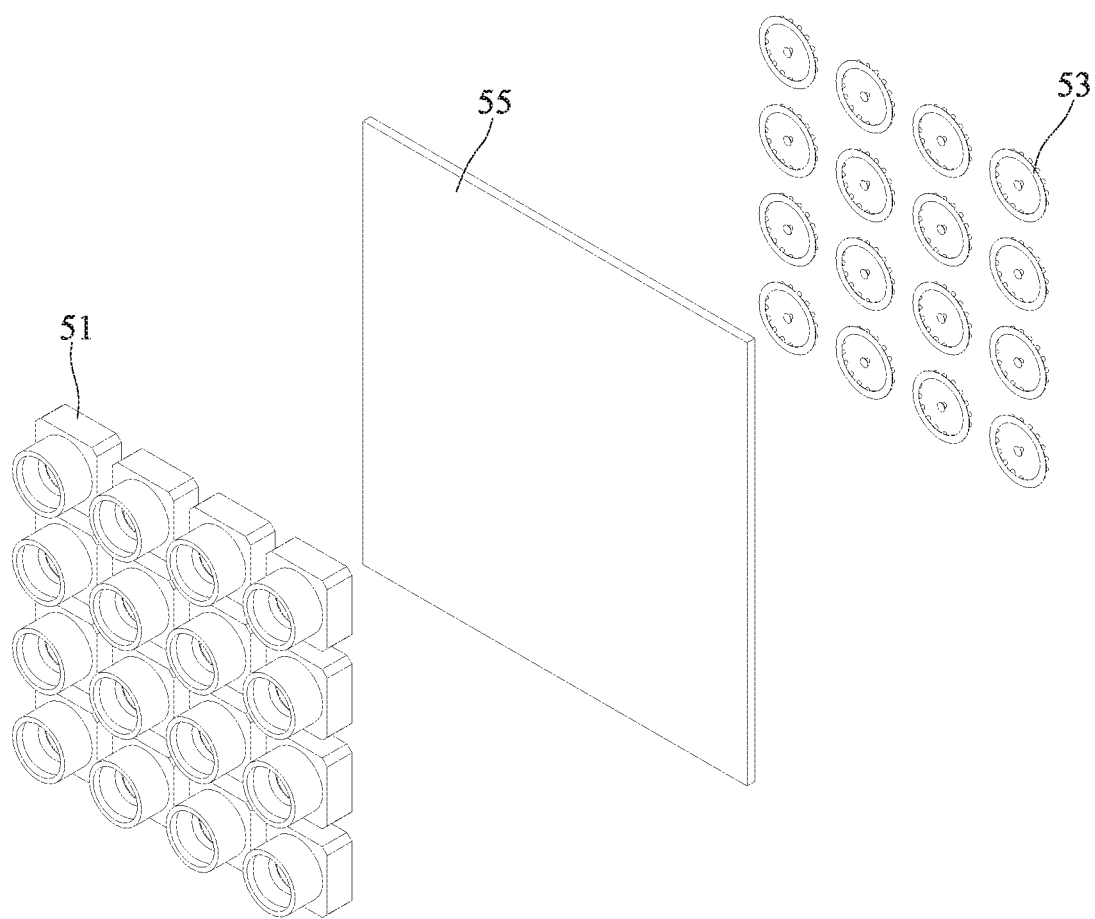
FIG. 3A is a perspective exploded view of the third embodiment of an AiP verification board of the present disclosure.
Figure 3B:
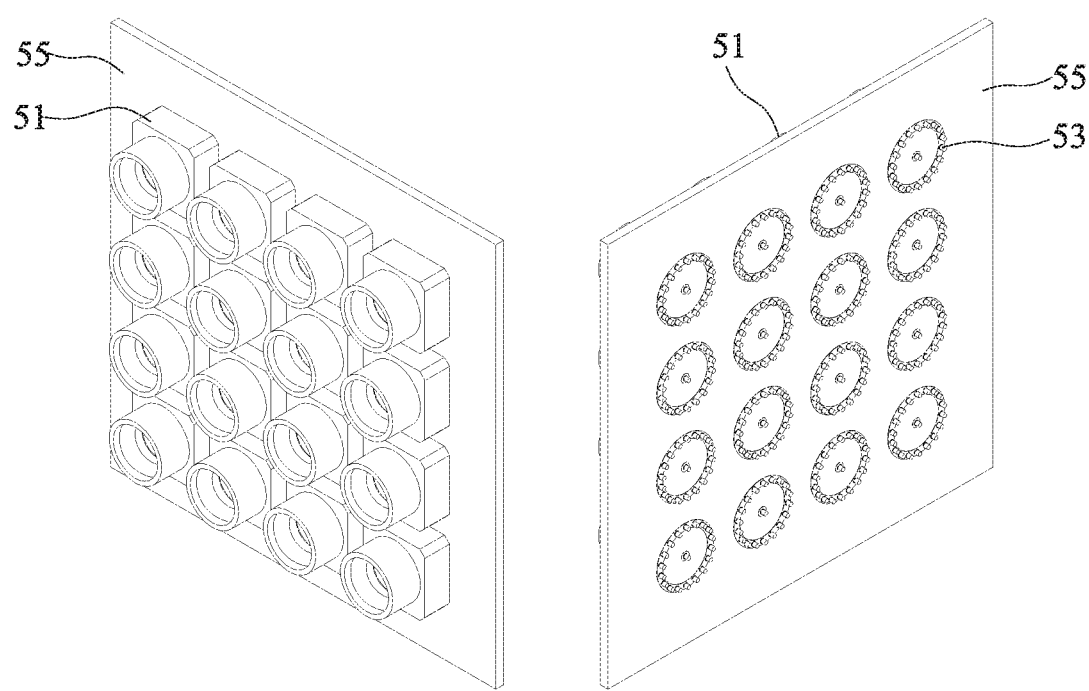
FIG. 3B is a perspective assembly view of the third embodiment of an AiP verification board of the present disclosure.

Please refer to FIG. 3A and FIG. 3B, which are a perspective exploded view and a perspective assembly view of the third embodiment of the AiP verification board of the present disclosure. The AiP verification board of the present disclosure includes a plurality of connectors 51 (for example, SMPM connectors) and a plurality of adaptor structures 53 (for example, Invispin). The plurality of SMPM connectors 51 are arranged in an array on one side of a carrier board (for example, a radio frequency circuit board 55 provided with a radio frequency circuit), and the plurality of adaptor structures 53 are arranged in an array on the other side of the radio frequency circuit board 55. The plurality of SMPM connectors 51 can be electrically connected with the plurality of adaptor structures 53 through the ground-signal-ground through holes in the carrier board.

In an embodiment, as shown in FIGS. 3A and 3B, the plurality of adaptor structures 53 are disposed on one side of the radio frequency circuit board 55, and the plurality of SMPM connectors 51 are disposed on the other side of the radio frequency circuit board 55. The plurality of adaptor structures 53 and the plurality of SMPM connectors 51 are arranged into a conversion structure including a 4×4 adaptor structure array and a 4×4 SMPM connector array, wherein each adaptor structure 53 is configured based on the ground-signal-ground (GSG) through holes. In other words, the plurality of SMPM connectors 51 of this embodiment can be directly connected with test equipment or instruments, while the plurality of adaptor structures 53 are quickly connected with the device under test (DUT). Therefore, the device under test only needs to have corresponding coaxial pads etched to be directly connected with the plurality of adaptor structures on the AiP verification board of the present disclosure, without the need for additional connectors. It is worth mentioning that the connection pad on each adaptor structure 53 can be designed or optimized into a suitable structure to achieve low loss conversion.

It is worth mentioning that since the plurality of SMPM connectors 51 can be directly connected with test equipment or instruments and the device under test does not require additional connectors or adaptor structures, this embodiment can test the characteristics of the antenna array of the antenna array board and the characteristics of the electronic components of the electronic circuit board separately through the plurality of SMPM connectors 51 and the plurality of adaptor structures 53 to reduce the difficulties of verification of millimeter wave antennas and its circuits.

In an embodiment, the AiP verification board provided with the plurality of SMPM connectors 51 and the plurality of adaptor structures 53 can be fixed on a beamforming test platform, and this embodiment can divide the AiP into antennas and circuits for separate tests. Therefore, it is not necessary to manufacture various circuit boards and antennas, thereby saving design costs.

In an embodiment, it is worth noting that a plurality of conversion verification boards provided with SMPM connectors 51 and adaptor structures 53 can be used to test and verify the device under test (for example, antenna array board or electronic circuit board) disposed in the middle, so the application will no longer be limited to the stacking restrictions of the circuit board itself.

The Fourth Embodiment

Figure 4A:
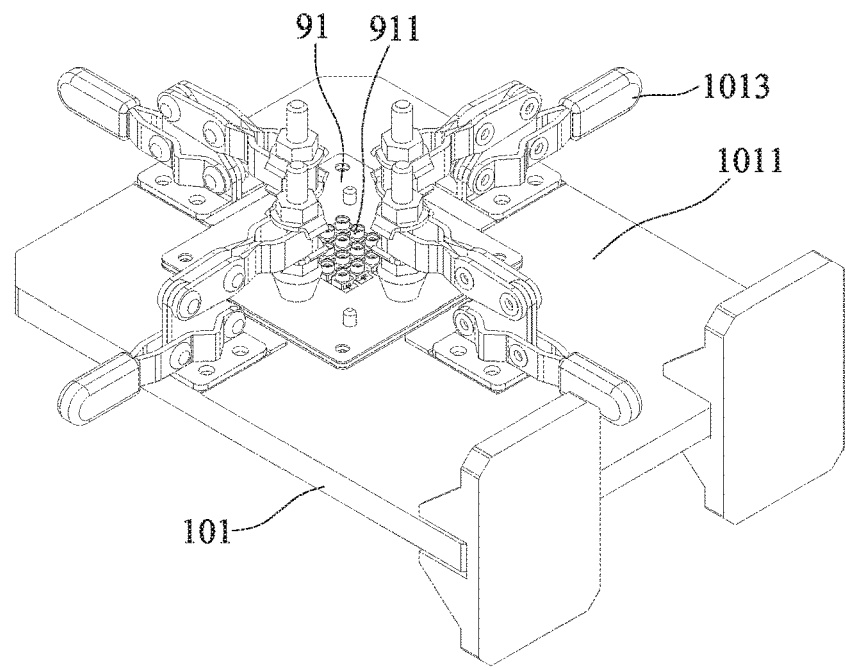
FIG. 4A is a perspective assembly top view of the fourth embodiment of an AiP verification board of the present disclosure.
Figure 4B:
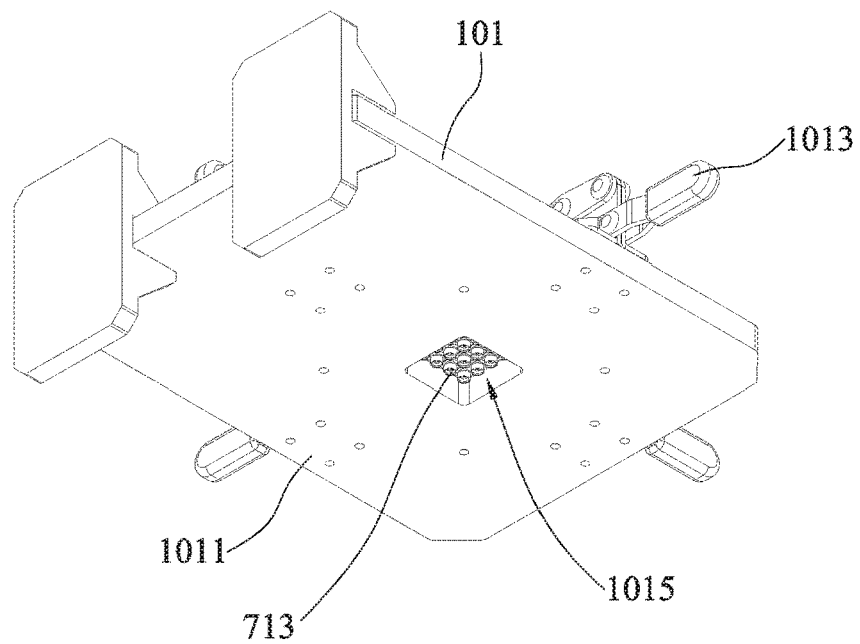
FIG. 4B is a perspective assembly bottom view of the fourth embodiment of an AiP verification board of the present disclosure.
Figure 4C:
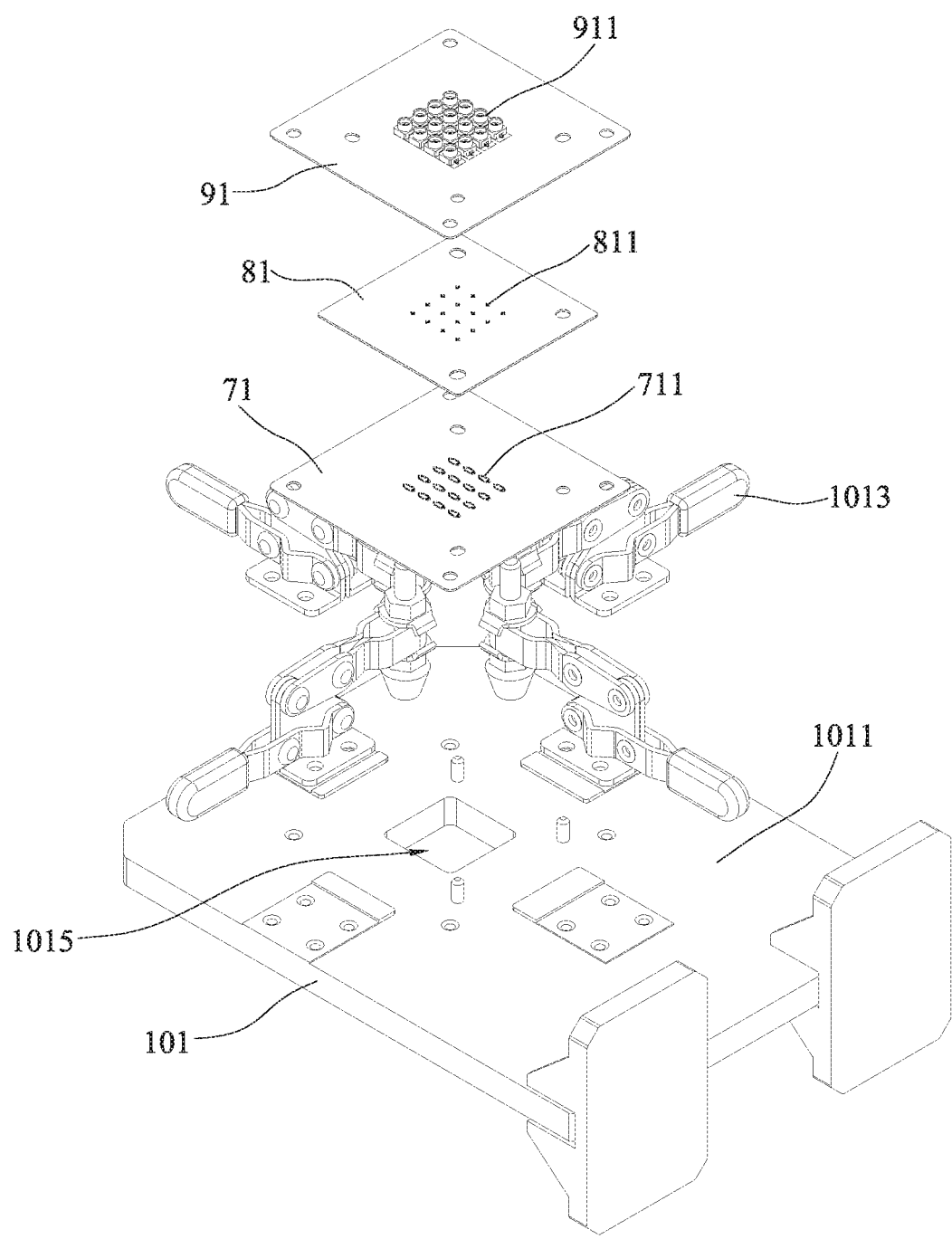
FIG. 4C is a perspective exploded view of the fourth embodiment of an AiP verification board of the present disclosure.

Please refer to FIG. 4A, FIG. 4B and FIG. 4C, which are a perspective assembled top view, a perspective assembled bottom view, and a perspective exploded view of the fourth embodiment of the AiP verification board of the present disclosure. This embodiment includes a bottom AiP verification board 71, a band-pass filter circuit board 81 and a top AiP verification board 91, wherein the band-pass filter circuit board 81 is disposed between the bottom AiP verification board 71 and the top AiP verification board 91. The band-pass filter circuit board 81 can also be replaced with other circuit boards. Alternatively, other circuit boards can be added above and/or below the band-pass filter circuit board 81. In other words, multiple circuit boards can be stacked between the bottom AiP verification board 71 and the top AiP verification board 91 to measure and verify the multiple circuit boards at the same time.

In an embodiment, the bottom AiP verification board 71, the band-pass filter circuit board 81, and the top AiP verification board 91 are stacked in order, and can be fixed on a beamforming test platform 101. The beamforming test platform 101 includes a jig body 1011 and a plurality of fixing clamps 1013. The aforementioned test platform and clamps are just examples and are not intended to limit the present disclosure. In addition, the center of the jig body 1011 in the beamforming test platform 101 of this embodiment has an opening 1015 to facilitate testing and verification of the upper sides and the lower sides of the AiP verification boards or the circuit boards disposed on the beamforming test platform 101 through the opening 1015.

Figure 5A:
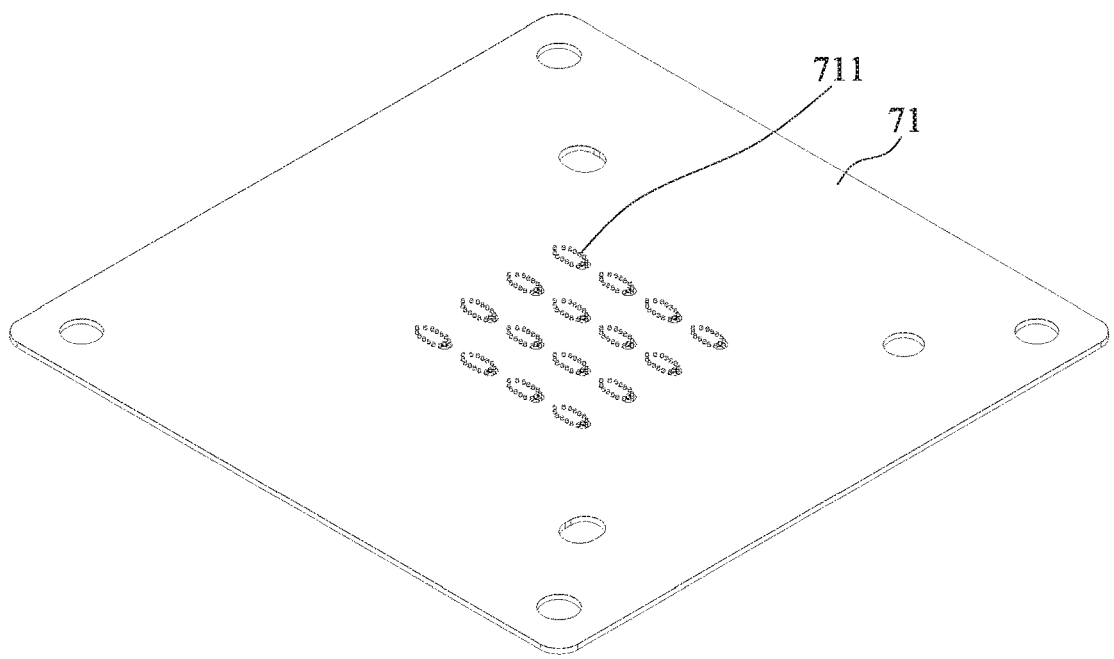
FIG. 5A is a perspective view of an upper part of a bottom AiP verification board of the fourth embodiment of an AiP verification board of the present disclosure.
Figure 5B:
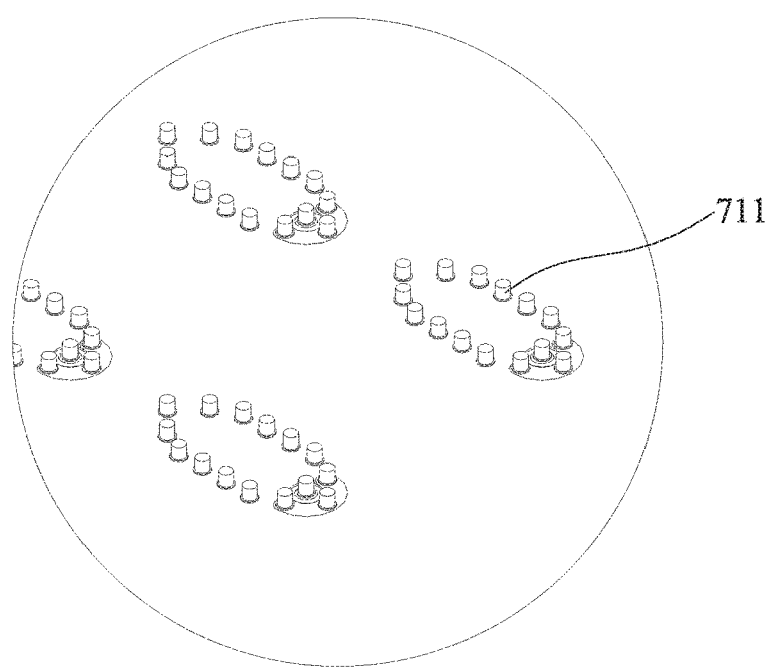
FIG. 5B is a partially enlarged perspective view of an upper part of a bottom AiP verification board of the fourth embodiment of an AiP verification board of the present disclosure.
Figure 6A:
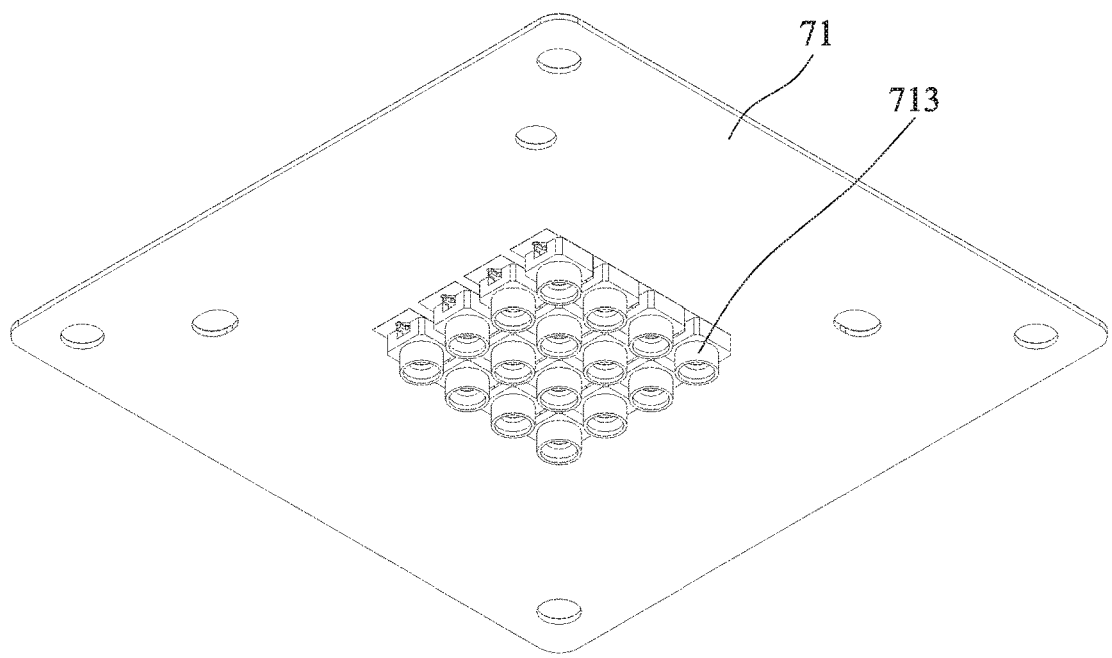
FIG. 6A is a perspective view of a lower part of a bottom AiP verification board of the fourth embodiment of an AiP verification board of the present disclosure.
Figure 6B:
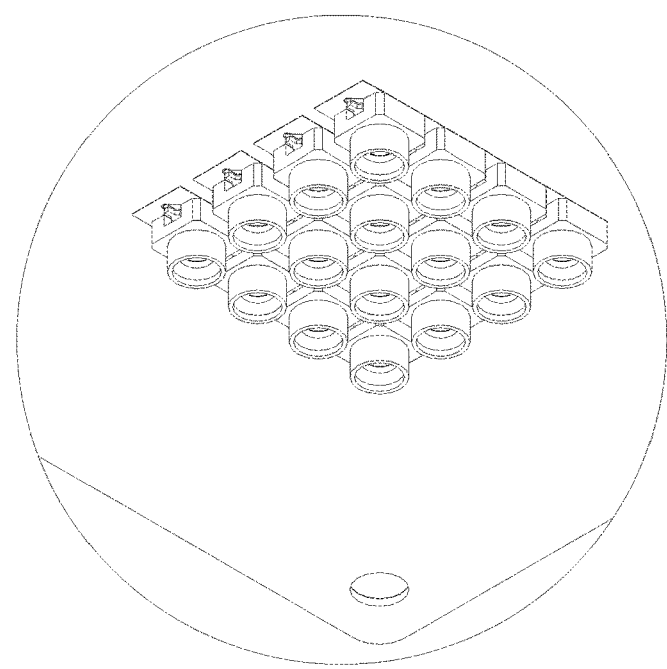
FIG. 6B is a partially enlarged perspective view of a lower part of a bottom AiP verification board of the fourth embodiment of an AiP verification board of the present disclosure.

FIG. 5A and FIG. 5B are respectively a perspective view and a partially enlarged perspective view of an upper part of the bottom AiP verification board 71 of this embodiment. FIG. 6A and FIG. 6B are respectively a perspective view and a partially enlarged perspective view of a lower part of the bottom AiP verification board 71 of this embodiment. As shown in FIGS. 4C, 5A, 5B, 6A and 6B, the upper part of the bottom AiP verification board 71 has a plurality of adaptor structures 711, and is electrically connected with the lower part of the band-pass filter circuit board 81. The plurality of adaptor structures 711 are arranged in an array. The lower part of the bottom AiP verification board 71 has a plurality of push-on connectors 713 (for example, SMPM connectors). The plurality of the push-on connectors 713 are also arranged in an array. The plurality of push-on connectors 713 and the plurality of adaptor structures 711 are electrically connected through ground-signal-ground (GSG) through holes (not shown).

Figure 7A:
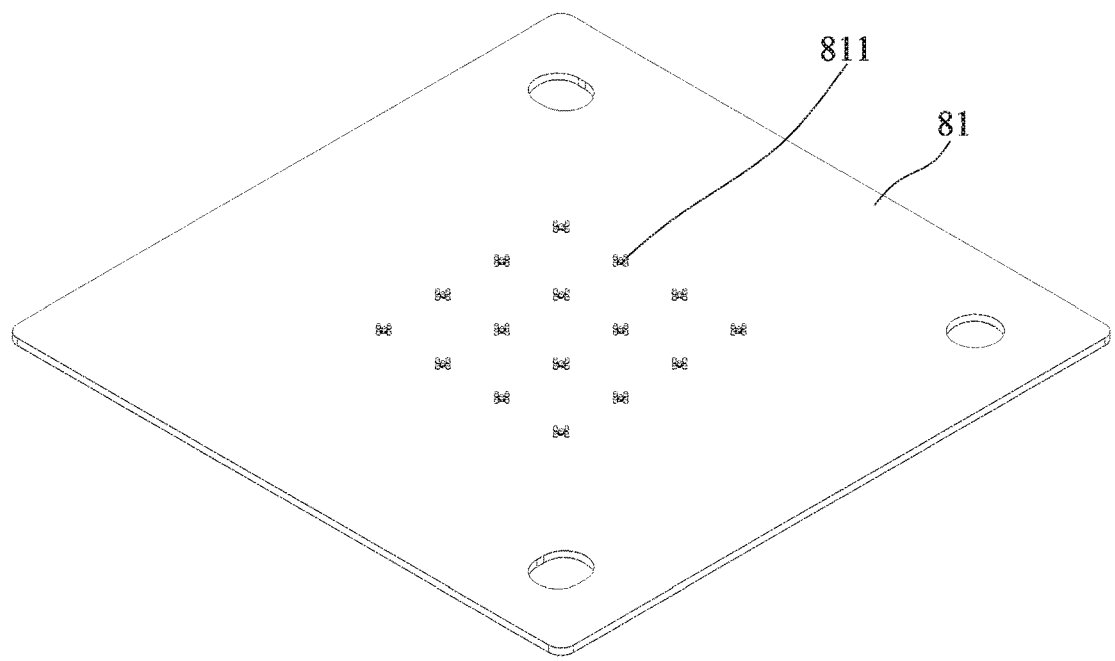
FIG. 7A is a perspective view of an upper part of a band-pass filter circuit board of the fourth embodiment of an AiP verification board of the present disclosure.
Figure 7B:
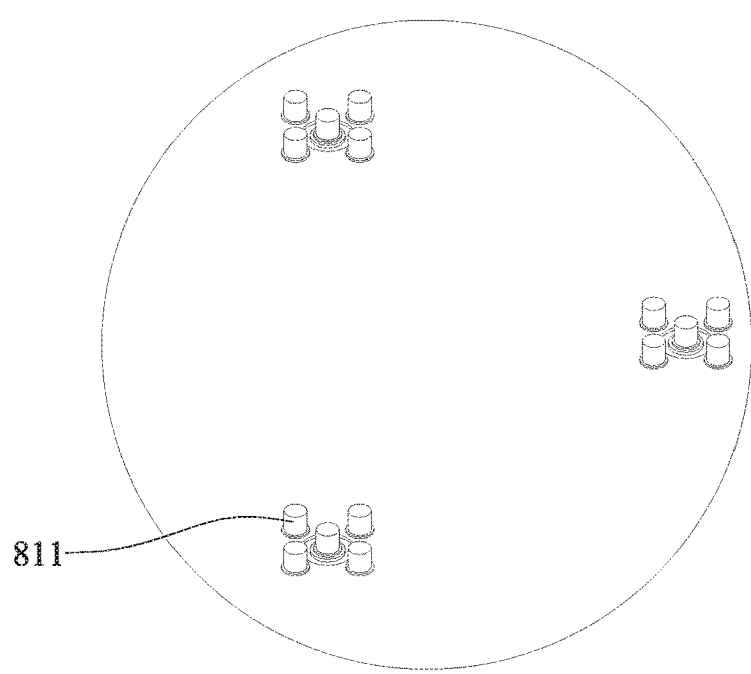
FIG. 7B is a partially enlarged perspective view of an upper part of a band-pass filter circuit board of the fourth embodiment of an AiP verification board of the present disclosure.
Figure 8A:
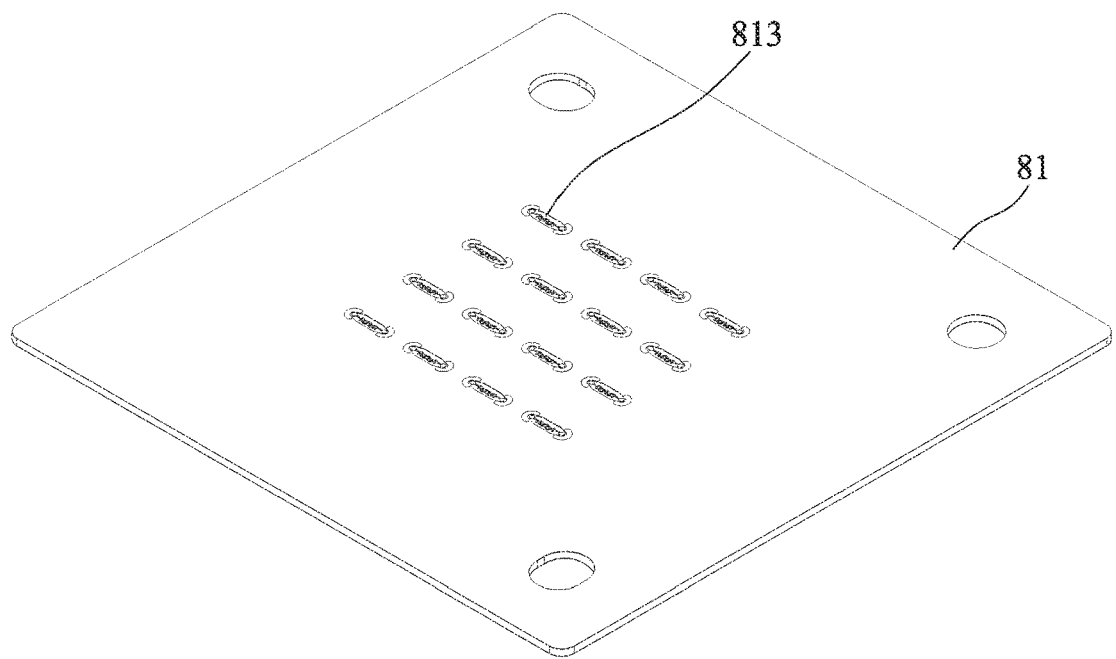
FIG. 8A is a perspective view of a lower part of a band-pass filter circuit board of the fourth embodiment of an AiP verification board of the present disclosure.
Figure 8B:
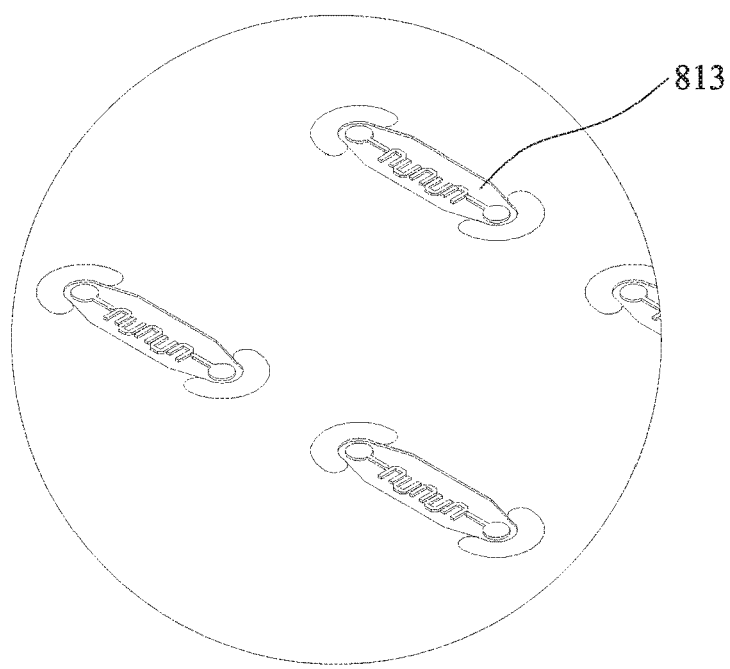
FIG. 8B is a partially enlarged perspective view of a lower part of a band-pass filter circuit board of the fourth embodiment of an AiP verification board of the present disclosure.

FIG. 7A and FIG. 7B are respectively a perspective view and a partially enlarged perspective view of an upper part of the band-pass filter circuit board 81 of this embodiment. As shown in FIG. 7A and FIG. 7B, the upper part of the band-pass filter circuit board 81 has a plurality of adaptor structures 811 and is electrically connected with the lower part of the top AiP verification board 91 above. The plurality of adaptor structures 811 are arranged in an array. FIG. 8A and FIG. 8B respectively show a perspective view and a partially enlarged perspective view of the lower part of the band-pass filter circuit board 81 of this embodiment. As shown in FIG. 8A and FIG. 8B, the lower part of the band-pass filter circuit board 81 is a band-pass filter circuit structure 813. The lower part of the band-pass filter circuit board 81 is electrically connected with the upper part of the bottom AiP verification board 71 below through ground-signal-ground (GSG) connection pads.

Figure 9A:
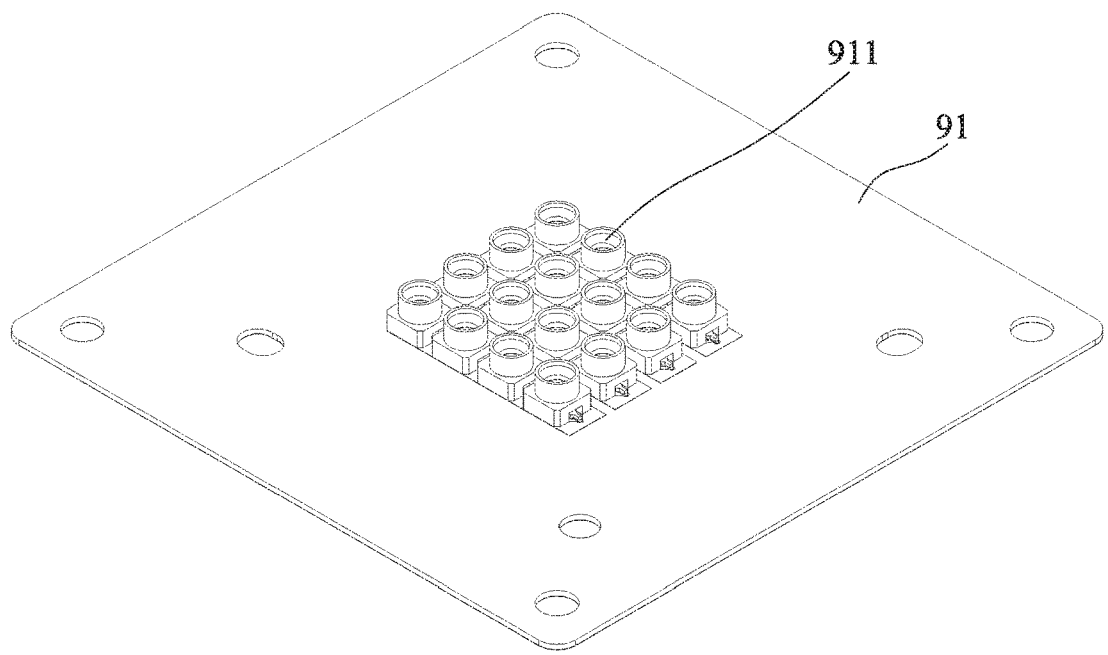
FIG. 9A is a perspective view of an upper part of a top AiP verification board of the fourth embodiment of an AiP verification board of the present disclosure.
Figure 9B:
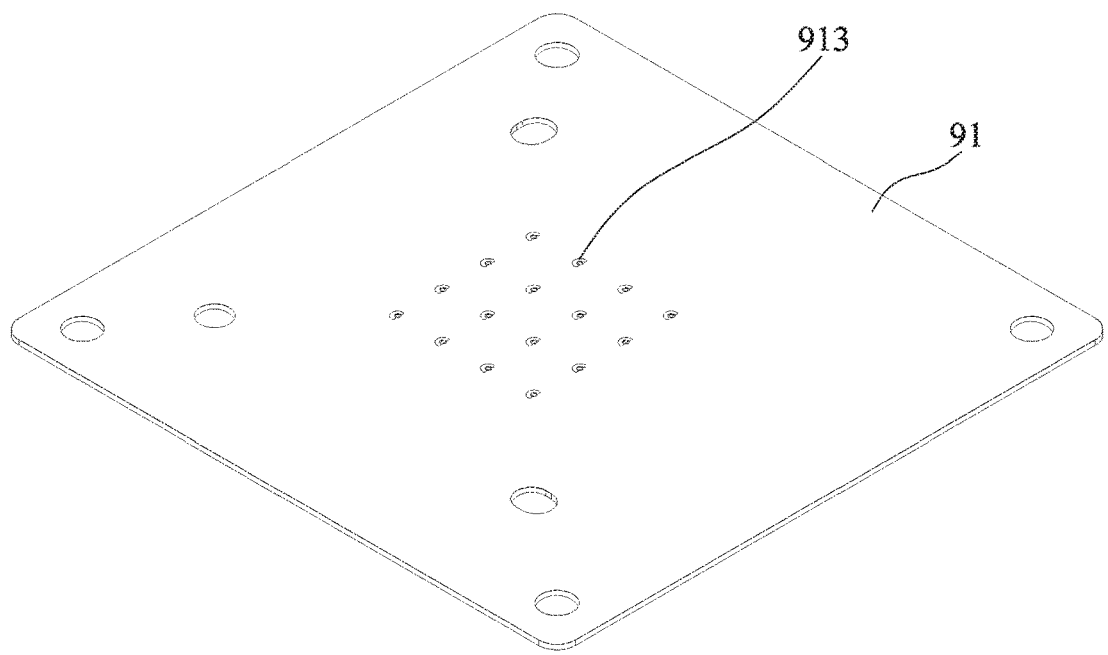
FIG. 9B is a perspective view of a lower part of a top AiP verification board of the fourth embodiment of an AiP verification board of the present disclosure.
Figure 9C:
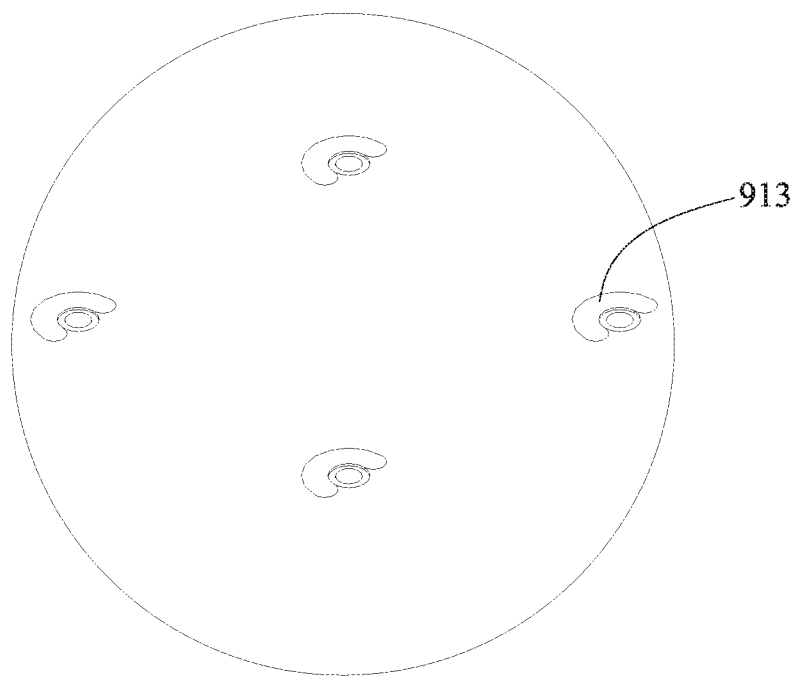
FIG. 9C is a partially enlarged perspective view of a lower part of a top AiP verification board of the fourth embodiment of an AiP verification board of the present disclosure.

FIG. 9A is a perspective view of the upper part of the top AiP verification board 91 of this embodiment, while FIG. 9B and FIG. 9C respectively show a perspective view and a partially enlarged perspective view of the lower part of the top AiP verification board 91 of this embodiment. As shown in FIGS. 9A, 9B and 9C, the upper part of the top AiP verification board 91 has a plurality of push-on connectors 911 (such as SMPM connectors). The lower part of the top AiP verification board 91 has a plurality of ground-signal-ground (GSG) connection pads 913, and is electrically connected to the upper part of the band-pass filter circuit board 81 below.

In summary, the aforementioned specific embodiments of the present disclosure can effectively shorten the development time of AiP, that is, the verification board of the present disclosure can be used to quickly swap antennas or circuits for their separate verification and testing, which can greatly shorten the development schedule of AiP. In addition, the integration of the overall test system can be more flexible in testing. Moreover, since the operating frequency bandwidth of a circuit is relatively wide and that of an antenna is relatively narrow, when testing the characteristics of different frequency bands, only the antennas needs to be replaced without the need to redesign and reproduce the circuits. Therefore, the application is broader than traditional test structures.

The aforementioned embodiments are exemplary to illustrate the technical principles, features and effects of the present disclosure, and are not intended to limit the implementable scope of the present disclosure. Anyone skilled in the art can modify and change the aforementioned embodiments provided that the spirit and scope of the present disclosure are not violated. However, any equivalent modifications and changes made by using the teachings of the present disclosure should still be covered by the following claims. The scope of protection of the rights of the present disclosure should be as recited in the following claims.

What is claimed is:

1. An antennas-in-package (AiP) verification structure, comprising:
    a carrier board configured for disposing an antenna array or an electronic circuit; and
    a plurality of push-on connectors arranged in an array on the carrier board,
    wherein the plurality of push-on connectors are electrically connected with the antenna array or the electronic circuit on the carrier board for testing characteristics of the antenna array on the carrier board or characteristics of the electronic circuit on the carrier board, and
    wherein the AiP verification structure is configured to be connected with a test equipment by the plurality of push-on connectors.

2. The AiP verification structure of claim 1, wherein each of the plurality of push-on connectors comprises a connection pad.

3. The AiP verification structure of claim 1, wherein the antenna array is a millimeter wave (mmWave) antenna array, and the electronic circuit is a millimeter wave electronic circuit.

4. The AiP verification structure of claim 1, which is configured to be fixed on a beamforming test platform.

5. The AiP verification structure of claim 1, wherein the push-on connectors are sub-miniature push-on micro (SMPM) connectors.

6. An antennas-in-package (AiP) verification structure, comprising:
    a carrier board configured for disposing an antenna array or an electronic circuit;
    at least one through hole having a ground-signal-ground (GSG) structure formed in the carrier board; and
    a plurality of adaptor structures arranged in an array on the carrier board,
    wherein the plurality of adaptor structures are electrically connected with the antenna array on the carrier board or the electronic circuit on the carrier board through the through hole having the GSG structure for testing characteristics of the antenna array on the carrier board or characteristics of the electronic circuit on the carrier board, and
    wherein the AiP verification structure is configured to be connected with a test equipment by the plurality of adaptor structures.

7. The AiP verification structure of claim 6, wherein each of the plurality of adaptor structures comprises a connection pad.

8. The AiP verification structure of claim 6, wherein the antenna array is a millimeter wave (mmWave) antenna array, and the electronic circuit is a millimeter wave electronic circuit.

9. The AiP verification structure of claim 6, which is configured to be fixed on a beamforming test platform.

10. An antennas-in-package (Ai P) verification structure, comprising:
    a carrier board configured for disposing a radio frequency circuit;
    at least one through hole having a ground-signal-ground (GSG) structure formed in the carrier board;
    a plurality of connectors arranged in an array on one side of the carrier board; and
    a plurality of adaptor structures arranged in an array on another side of the carrier board,
    wherein the plurality of connectors are electrically connected with the plurality of adaptor structures through the through hole having the GSG structure, and
    wherein the AiP verification structure is configured to be connected with a test equipment by the plurality of connectors and connected with a device under test by the plurality of adaptor structures.

11. The AiP verification structure of claim 10, wherein each of the plurality of connectors comprises a connection pad.

12. The AiP verification structure of claim 10, wherein each of the plurality of adaptor structures comprises a connection pad.

13. The AiP verification structure of claim 10, wherein the device under test is a millimeter wave (mmWave) antenna array or a millimeter wave electronic circuit.

14. The AiP verification structure of claim 10, which is configured to be fixed on a beamforming test platform.

15. The AiP verification structure of claim 10, wherein the plurality of connectors are sub-miniature push-on micro (SMPM) connectors.

* * * * *